US009923009B1

(12) United States Patent
Hsiung et al.

(10) Patent No.: US 9,923,009 B1
(45) Date of Patent: Mar. 20, 2018

(54) IMAGE SENSOR WITH HYBRID DEEP TRENCH ISOLATION

(71) Applicant: OMNIVISION TECHNOLOGIES, INC., Santa Clara, CA (US)

(72) Inventors: Chih-Wei Hsiung, San Jose, CA (US); Duli Mao, Sunnyvale, CA (US); Vincent Venezia, Los Gatos, CA (US); Gang Chen, San Jose, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/342,817

(22) Filed: Nov. 3, 2016

(51) Int. Cl.
*H01L 27/146* (2006.01)
*H01L 21/762* (2006.01)
*H01L 21/306* (2006.01)

(52) U.S. Cl.
CPC .... *H01L 27/1463* (2013.01); *H01L 21/30604* (2013.01); *H01L 21/76224* (2013.01); *H01L 27/14629* (2013.01); *H01L 27/14643* (2013.01); *H01L 27/14685* (2013.01); *H01L 27/14621* (2013.01); *H01L 27/14627* (2013.01)

(58) Field of Classification Search
CPC ........... H01L 27/1463; H01L 27/14629; H01L 21/76224; H01L 27/14685; H01L 27/14643; H01L 21/30604; H01L 27/14621; H01L 27/14627

USPC ........................................................ 257/432
See application file for complete search history.

(56) References Cited

U.S. PATENT DOCUMENTS 8,941,204 B2 1/2015 Lin et al.
9,111,993 B1 * 8/2015 Zheng ............... H01L 21/76224

* cited by examiner

*Primary Examiner* — Fernando L Toledo
*Assistant Examiner* — Adam S Bowen
(74) *Attorney, Agent, or Firm* — Christensen O'Connor Johnson Kindness PLLC

(57) ABSTRACT

An image sensor includes a plurality of photodiodes disposed in a semiconductor material between a first side and a second side of the semiconductor material. The image sensor also includes a plurality of hybrid deep trench isolation (DTI) structures disposed in the semiconductor material, where individual photodiodes in the plurality of photodiodes are separated by individual hybrid DTI structures. The individual hybrid DTI structures include a shallow portion that extends from the first side towards the second side of the semiconductor material, and the shallow portion includes a dielectric region and a metal region such that at least part of the dielectric region is disposed between the semiconductor material and the metal region. The hybrid DTI structures also include a deep portion that extends from the shallow portion and is disposed between the shallow portion and the second side of the semiconductor material.

18 Claims, 8 Drawing Sheets

IMAGE SENSOR WITH HYBRID DEEP TRENCH ISOLATION

TECHNICAL FIELD

This disclosure relates generally to semiconductor image sensors, and in particular but not exclusively, relates to semiconductor image sensors with hybrid deep trench isolation structures.

BACKGROUND INFORMATION

Image sensors have become ubiquitous. They are widely used in digital still cameras, cellular phones, security cameras, as well as, medical, automobile, and other applications. The device architecture of image sensors has continued to advance at a great pace due to increasing demands for higher resolution, lower power consumption, increased dynamic range, etc. These demands have also encouraged the further miniaturization and integration of image sensors into these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

The miniaturization of image sensors may result in a decreased distance between neighboring photosensitive elements. As the distance between photosensitive elements decreases, the likelihood and magnitude of crosstalk between photosensitive elements may increase.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
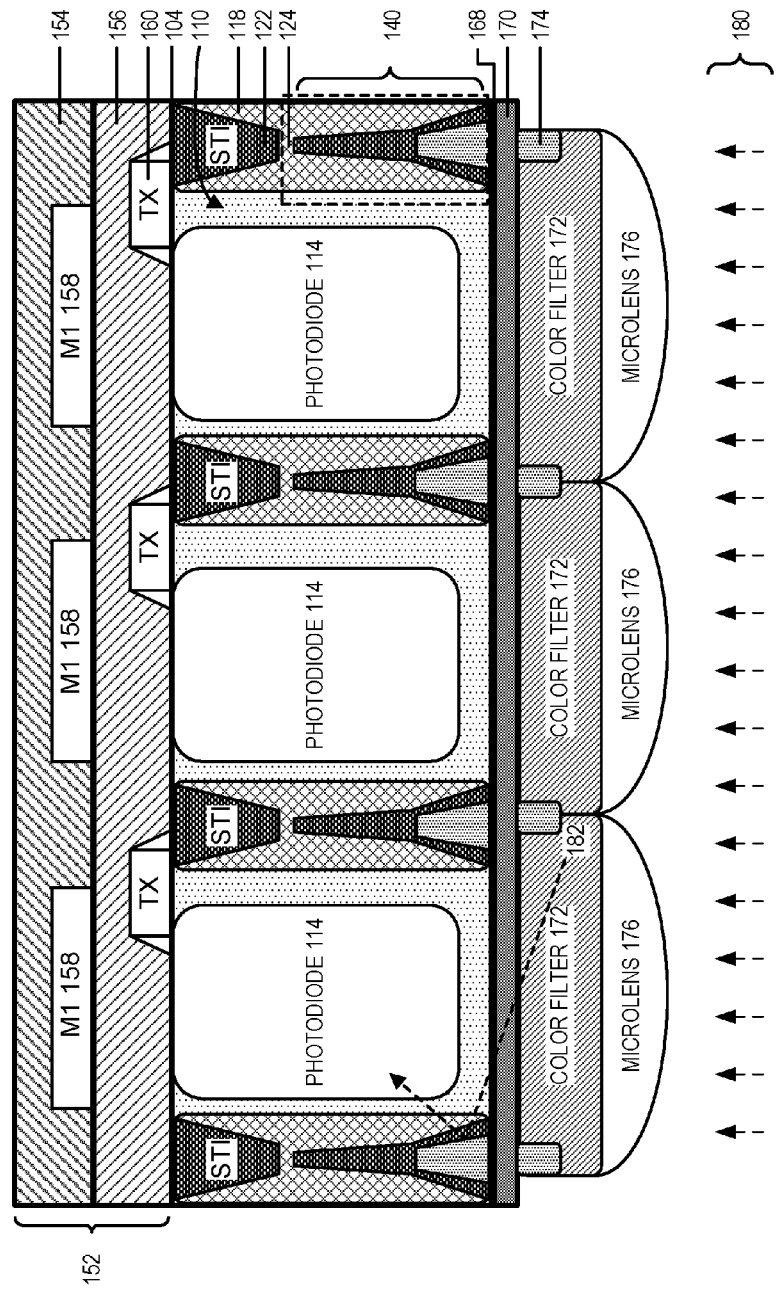
FIG. 1A is a cross sectional illustration of an example image sensor with hybrid deep trench isolation structures, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with hybrid deep trench isolation structures are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example image sensor 100. Image sensor 100 includes semiconductor material 110 (with a first side 168 and a second side 104), plurality of photodiodes 114, plurality of pinning wells 118 (including first region 124), plurality of shallow trench isolation structures 122, plurality of hybrid deep trench isolation structures 140, dielectric material 170, plurality of color filters 172, plurality of metal grids 174, plurality of microlenses 176, interconnect layer 152 (including dielectric material 154, dielectric material 156, first metal layer 158, and plurality of transfer gates 160).

As illustrated, image sensor 100 includes a plurality of photodiodes 114 disposed in a semiconductor material 110 between a first side 168 and a second side 104 of the semiconductor material 110. Image sensor 100 also includes a plurality of hybrid deep trench isolation structures 140 disposed in the semiconductor material 110. In one example, each one of the individual photodiodes 114 are separated by individual hybrid deep trench isolation structures 140. A plurality of pinning wells 118 are disposed in semiconductor material 110 and extend from the first side 168 to the second side 104 of semiconductor material 110. Individual hybrid deep trench isolation structures 140 may be disposed in individual pinning wells 118. Image sensor 100 may also include a plurality of shallow trench isolation structures 122 with individual shallow trench isolation structures 122 disposed in individual pinning wells 118 between the first side 168 and the second side 104 of the semiconductor material 110. Individual shallow trench isolation structures 122 may be optically aligned with the individual hybrid deep trench isolation structures 140 with respect to incident light 180 that is normal to the first side 168 of semiconductor material 110. In one example, each individual pinning well 118 includes a respective optically aligned hybrid deep trench isolation structure 140 and a respective shallow trench isolation structure 122 such that the ratio of individual pinning wells 118, shallow trench isolation structures 122, and hybrid deep trench isolation structures 140 is 1:1:1.

Figure 1B:
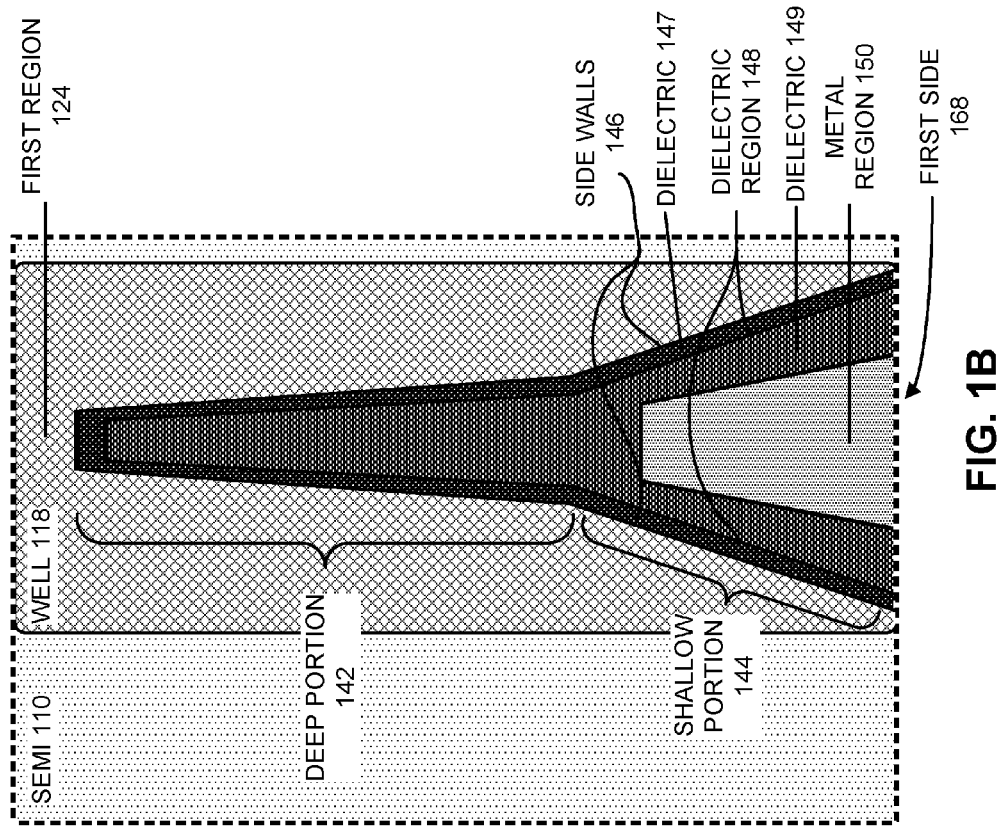
FIG. 1B is a magnified illustration of an example hybrid deep trench isolation structure included in the image sensor of FIG. 1A, in accordance with the teachings of the present invention.

FIG. 1B is a magnified illustration of an example hybrid deep trench isolation structure 140 included in the image sensor 100 of FIG. 1A. In the illustrated example, each one of the individual hybrid deep trench isolation structures 140 includes a shallow portion 144 and a deep portion 142. The shallow portion 144 extends from the first side 168 towards the second side 104 of semiconductor material 110. The shallow portion 144 includes a dielectric region 148 and a metal region 150 such that at least part of the dielectric region 148 is disposed between the semiconductor material 110 and the metal region 150. The dielectric region may include a first dielectric 147 and a second dielectric 149. In the illustrated example, at least part of the second dielectric is disposed between the first dielectric and the metal region. The deep portion 142 of the individual hybrid deep trench isolation structure 140 extends from the shallow portion 144 and is disposed between the shallow portion 144 and the second side 104 of the semiconductor material 110.

In one example, the first dielectric 147 and the second dielectric 149 extend from the shallow portion 144 into the deep portion 142. The dielectric constant of the first dielectric is greater than the dielectric constant of the second dielectric. The first dielectric is a high-k material such as $HfO_2$ and the second dielectric material is not a high-k material such as $SiO_2$. In another example the dielectric materials of the deep portion 142, the dielectric region 148 in the shallow portion 144, and dielectric materials 154, 156, and 170 may be the same or different dielectric materials. In some examples, the dielectric material may include oxides/nitrides such as silicon oxide ($SiO_2$), hafnium oxide ($HfO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be used, in accordance with the teachings of the present invention.

The dielectric region 148 in the shallow portion 144 and the deep portion 142 of the individual hybrid deep trench isolation structures 140 may, at least partially, electrically isolate individual photodiodes 114 disposed proximate to the first side 168 of semiconductor material 110. The metal region 150 is also electrically isolated from individual photodiodes 114. Electrically isolating individual photodiodes 114 with hybrid deep trench isolation structures 140 may reduce the magnitude of electrical crosstalk between photodiodes 114 in the plurality of photodiodes 114.

The metal region 150 in the individual hybrid deep trench isolation structures 140 may reduce the magnitude of optical crosstalk between photodiodes 114 in the plurality of photodiodes 114. Metal region 150 may absorb, reflect, or refract incident light 180 such that it minimizes optical crosstalk. In one example, at least part of the metal region 150 is wider than the deep portion 142 of the hybrid deep trench isolation structure 140. As illustrated, the metal region 150 of the individual hybrid deep trench isolation structures 140 may taper from the first side 168 of the semiconductor material 110 towards the deep portion 142. The amount of taper for the metal region 150 may be designed such that off-axis incident light 182 propagates through the first side 168 of the semiconductor material 110 and is reflected by the metal region 150 towards the plurality of photodiodes 114. In another example, the metal region 150 may extend through the first dielectric 147, the second dielectric 149, and dielectric material 170 such that a portion of the metal region 150 forms the plurality of metal grids 174. Alternatively, the metal region 150 may not extend beyond any one of the first dielectric material 147, the second dielectric material 149, or dielectric material 170.

In one example, the shallow portion 144 of hybrid deep trench isolation structure 140 tapers from the first side 168 of semiconductor material 110 towards the deep portion 142 such that a width of the shallow portion 144 proximate to the first side 168 is greater than the width of the shallow portion 144 proximate to the second side 104 of semiconductor material 110. The resistance of the dielectric region 148 may be controlled, in part, by modifying the shape of the dielectric region 148. In one example, the shallow portion 144 and the metal region 150 may taper by the same relative amount such that the width of the dielectric region 148 is constant throughout the length of the shallow portion 144. Alternatively, as illustrated in FIG. 1B, the side walls 146 of the shallow portion 144 may taper more relative to the metal region 150 such that the width of the dielectric region 148 proximate to the first side 168 is larger than the width of the dielectric region 148 proximate to the second side 104 of semiconductor material 110. In another example, the metal region 150 may not taper at all and instead may have a substantially constant width.

Referring back to FIG. 1A The shallow trench isolation structures 122 may, at least partially, electrically isolate individual photodiodes 114 proximate to the second side 104 of the semiconductor material 110. As illustrated, the individual shallow trench isolation structures 122 may taper from the second side 104 of the semiconductor material 110 towards the deep portion 142 such that a width of the individual shallow trench isolation structures 122 proximate to the second side 104 of the semiconductor material 110 is greater than the width of the individual shallow trench isolation structures 122 proximate to the deep portion 142 of the hybrid deep trench isolation structures 140.

In one example, individual hybrid deep trench isolation structures 140 and individual shallow trench isolation structures 122 may directly contact each other. As illustrated in another example, a first region 124 of the pinning well 118 may be disposed between optically aligned individual hybrid deep trench isolation structures 140 and individual shallow trench isolation structures 122. The first region 124 of the pinning well 118 may ensure the hybrid deep trench isolation structure 140 is not in direct contact with the shallow trench isolation structures 122. In the illustrated example, at least part of the individual shallow trench isolation structure 122 is wider than the deep portion 142 of the individual hybrid deep trench isolation structures 140.

Figure 1C:
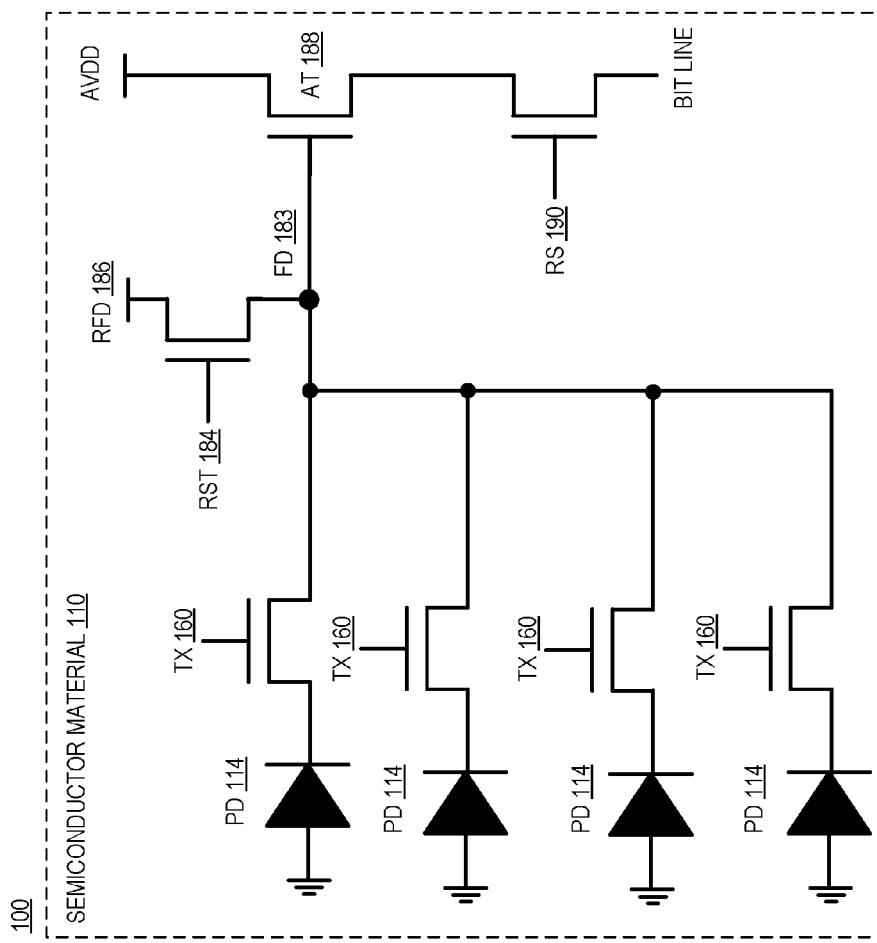
FIG. 1C is an example circuit diagram of the image sensor in FIG. 1A, in accordance with the teachings of the present invention.

FIG. 1C is an example circuit diagram of image sensor 100 in FIG. 1A. As illustrated in FIG. 1C, image sensor 100 includes: semiconductor material 110, a plurality of photodiodes 114, a plurality of transfer gates 160, floating diffusion 183, reset transistor 184, amplifier transistor 188, and row select transistor 190. The plurality of photodiodes 114 is disposed in semiconductor material 110 to accumulate image charge photogenerated in response to incident image light directed into plurality of photodiodes 114. In one example, semiconductor material 110 may include silicon, but may include other suitable semiconductor materials and dopant atoms. Plurality of transfer gates 160 is also disposed in semiconductor material 110, and individual transfer gates are coupled to individual photodiodes 114. Floating diffusion 183 is disposed in semiconductor material 110, and floating diffusion 183 is coupled to the plurality of transfer gates 160 to receive image charge from plurality of photodiodes 114 in response to a transfer signal sequentially applied to a control terminal of each individual transfer gate 160. In other words, in the depicted example, a transfer signal is applied to the control terminal of the top transfer gate 160, then a transfer signal is applied to the control terminal of the second-from-the-top transfer gate 160, etc. Reset transistor 184 is coupled to floating diffusion 183 to extract the image charge from floating diffusion 183. Further, amplifier transistor 188 is coupled to floating diffusion 183, and row select transistor 190 is coupled between an output of amplifier transistor 188 and a bit line output. In one example, amplifier transistor 188 includes a source follower coupled transistor.

Although not depicted in FIG. 1A, readout circuitry may be at least partially disposed in interconnect layer 152. For example, the gate electrodes of the transistors of the readout circuitry may be disposed at least partially in an interconnect layer (see supra interconnect layer 152) to readout image charge from the plurality of photodiodes 114 disposed in semiconductor material 110.

In the depicted example of FIG. 1C, plurality of photodiodes 114 includes four photodiodes 114 coupled to floating diffusion 183 through transfer gates 160. However, in a different example, any number of photodiodes 114 may be coupled to floating diffusion 183 including two, six, and eight photodiodes 114. In the depicted example, the four photodiodes 114 include two photodiodes 114 disposed to absorb green image light, one photodiode 114 disposed to absorb blue image light, and one photodiode 114 disposed to absorb red image light.

Figure 2:
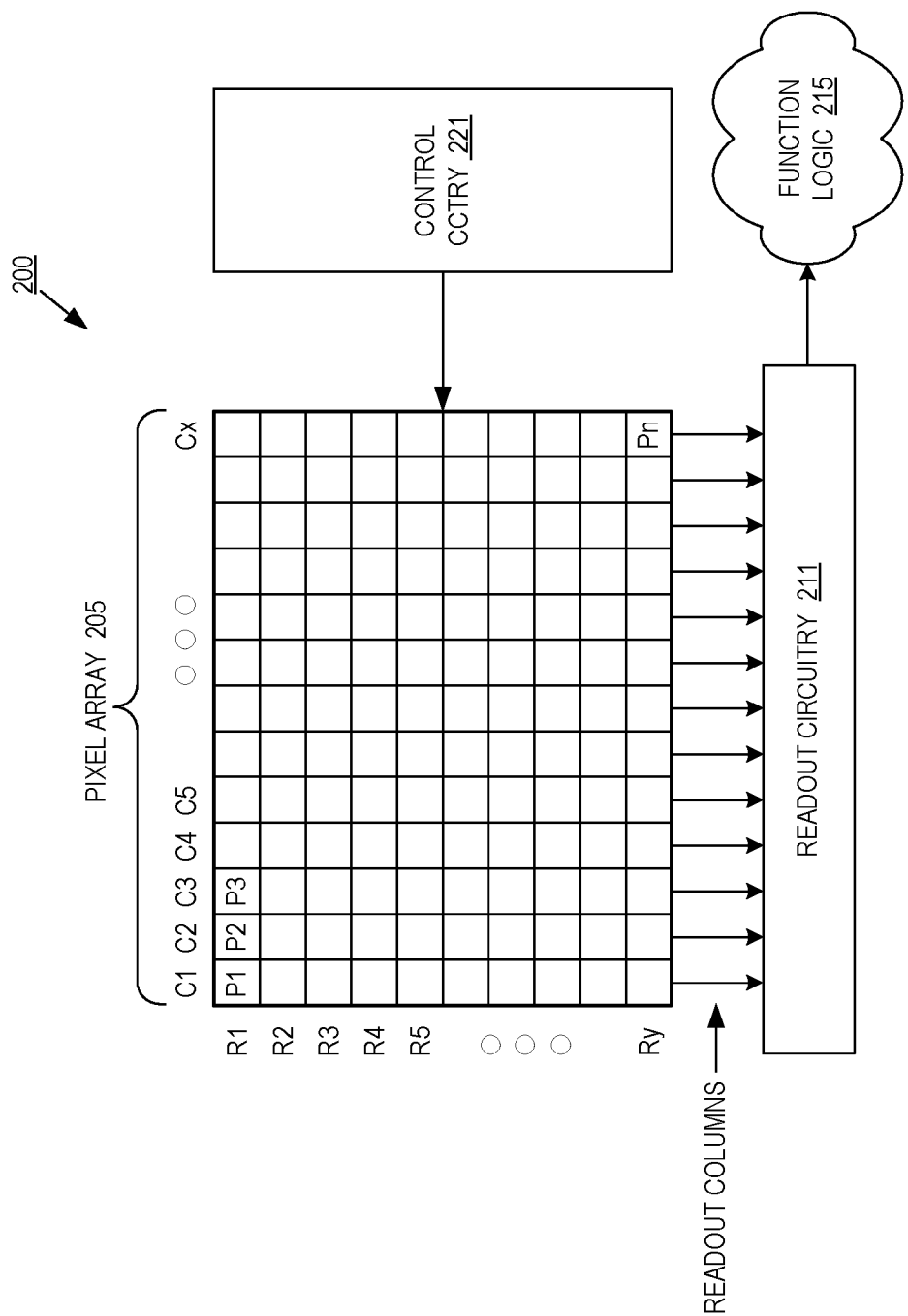
FIG. 2 is a block diagram illustrating one example of an imaging system including the image sensor of FIG. 1A, in accordance with the teachings of the present invention.

FIG. 2 is a block diagram illustrating one example of imaging system 200 including the image sensor 100 of FIG. 1A. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

FIGS. 3A-3K illustrates an example method 300 for fabrication of an image sensor with hybrid deep trench isolation structures (e.g. image sensor 100 of FIG. 1A). The order in which some or all of FIGS. 3A-3K appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process figures in order to avoid obscuring certain aspects. Alternatively, method 300 may include additional process figures that may not be necessary in some embodiments/examples of the disclosure.

Figure 3A:
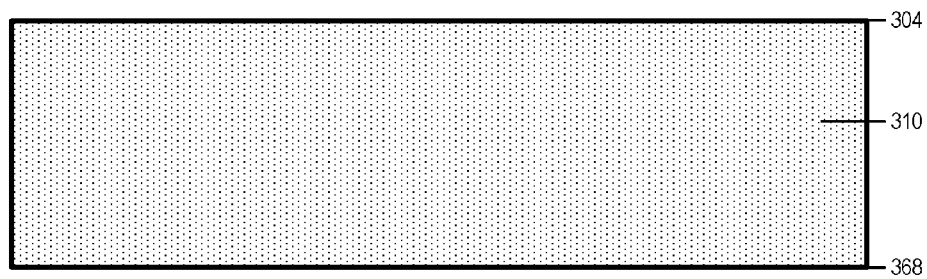
FIGS. 3A-3K illustrate an example method of imaging system fabrication for the image sensor of FIG. 1A, in accordance with the teachings of the present invention.

FIG. 3A illustrates providing a semiconductor material 310 having a first side 368 opposite a second side 304. In one example, semiconductor material 310 is silicon.

Figure 3B:
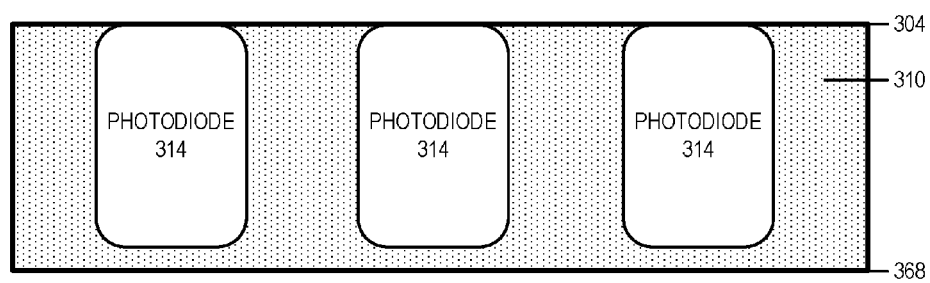

FIG. 3B illustrates forming a plurality of photodiodes 314 disposed in the semiconductor material 310 between the first side 368 and the second side 304. In one example, the plurality of photodiodes 314 is formed by ion implantation.

Figure 3C:
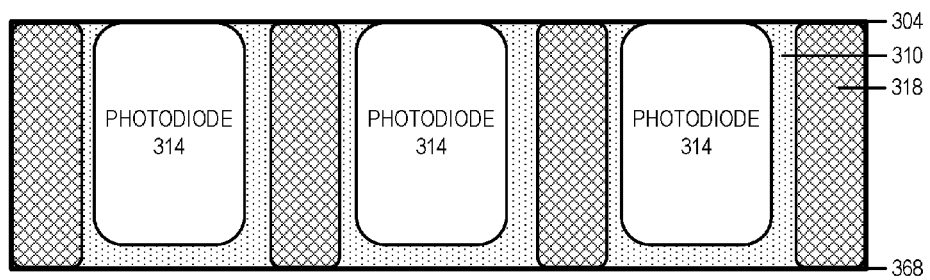

FIG. 3C illustrates forming a plurality of pinning wells 318 disposed in the semiconductor material 310. Individual pinning wells 318 in the plurality of pinning wells 318 may extend from the first side 368 to the second side 304 of semiconductor material 310. In one example, individual photodiodes 314 in the plurality of photodiodes 314 are disposed between individual pinning wells 318 in the plurality of pinning wells 318. In one example, the plurality of pinning wells 318 is formed by ion implantation.

Figure 3D:
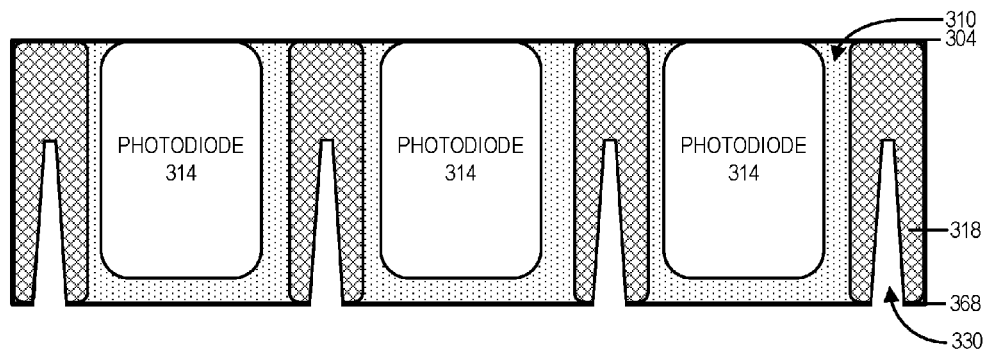

FIG. 3D illustrates etching a plurality of first trenches 330 that extend from the first side 368 towards the second side 304 of semiconductor material 310. In one example, individual first trenches 330 are etched within individual pinning wells 318 such that each first trench 330 is disposed within a corresponding pinning well 318.

Figure 3E:
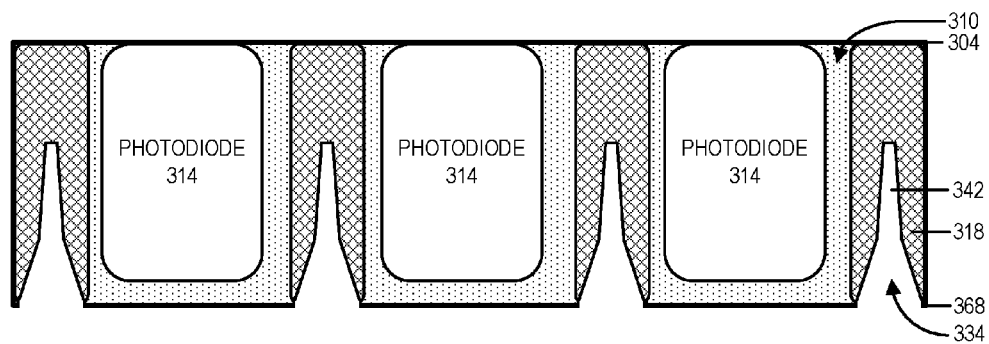

FIG. 3E illustrates widening a shallow portion 334 in each one of the plurality of first trenches 330 proximate to the first side 368 of the semiconductor material 310. In one example, a deep portion 342 in the plurality of first trenches 330 is disposed between the shallow portion 334 and the second side 304 of the semiconductor material 310. In one example, the shallow portion 334 tapers from the first side 368 towards the second side 304 of the semiconductor material 310 such that a width of the shallow portion 334 proximate to the first side 368 is greater than the width of the shallow portion 334 proximate to the second side 304.

Figure 3F:
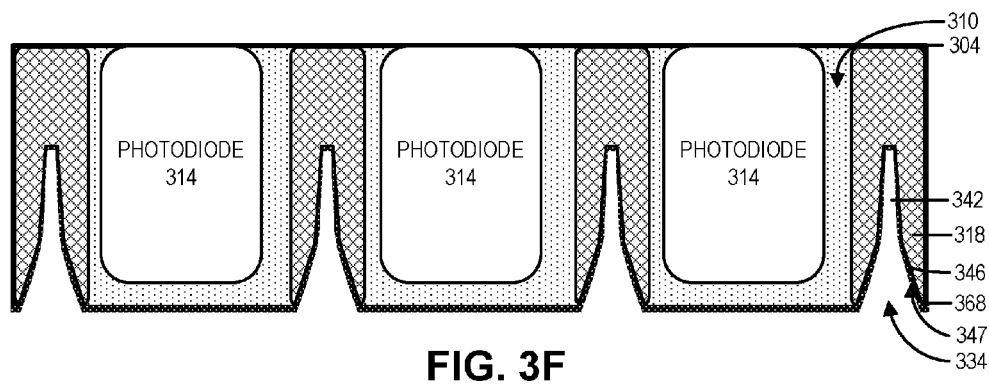

FIG. 3F illustrates depositing a first dielectric material 347 within the deep portion 342 and the shallow portion 334 in the plurality of first trenches 330.

Figure 3G:
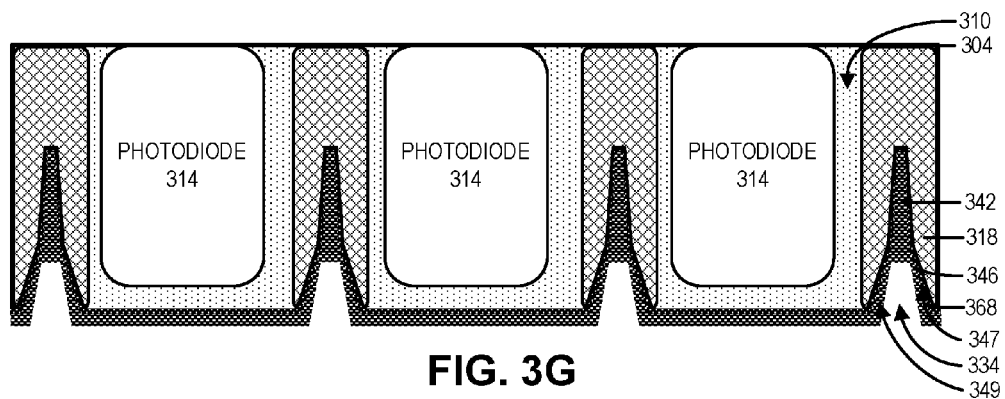

FIG. 3G illustrates depositing a second dielectric material 349 within the deep portion 342 and the shallow portion 334.

Figure 3H:
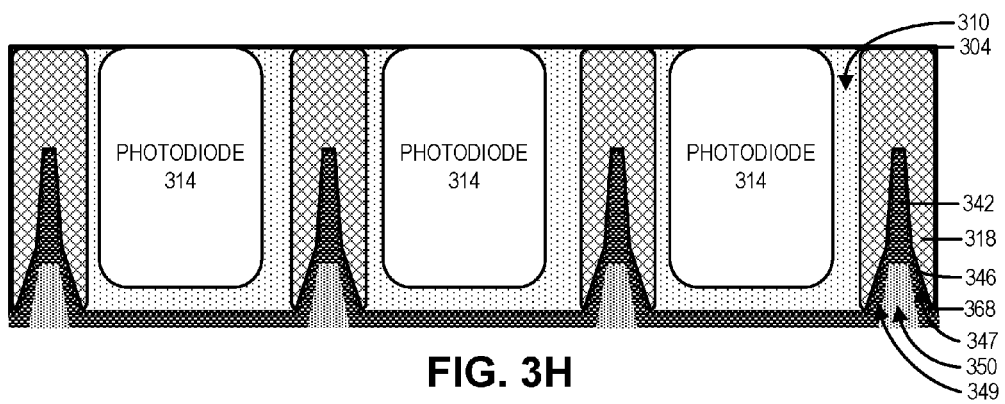

FIG. 3H illustrates depositing a metal 350 within the shallow portion 334 such that at least part of the second dielectric material 349 is disposed between the first dielectric material 347 and the metal region 350.

Figure 3I:
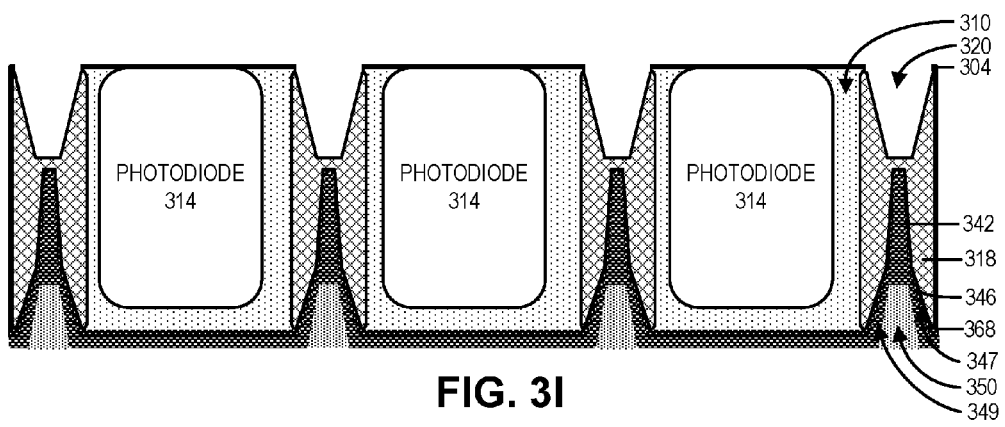

FIG. 3I illustrates etching a plurality of second trenches 320 that extend from the second side 304 of the semiconductor material 310 towards the deep portion 342 in the plurality of first trenches 330. In one example, individual second trenches 320 in the plurality of second trenches 320 are optically aligned with the individual first trenches 330.

Figure 3J:
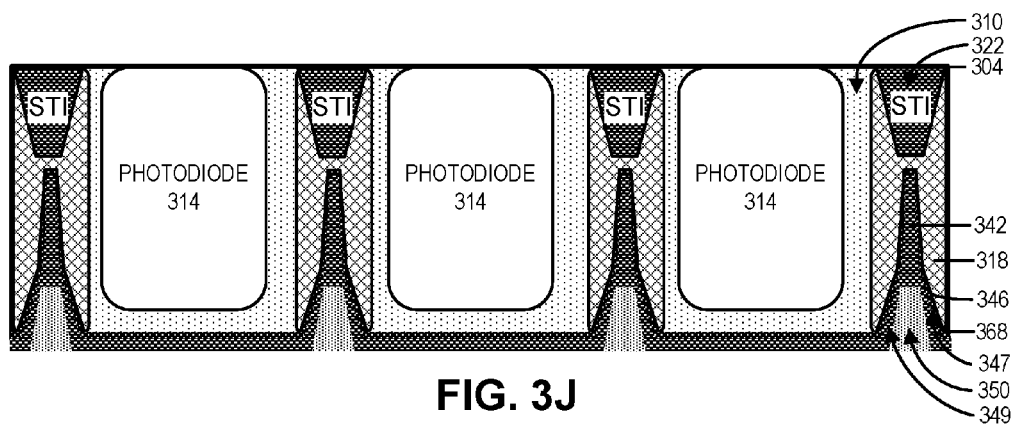

FIG. 3J illustrates depositing a third dielectric material 322 within the plurality of second trenches 320.

Figure 3K:
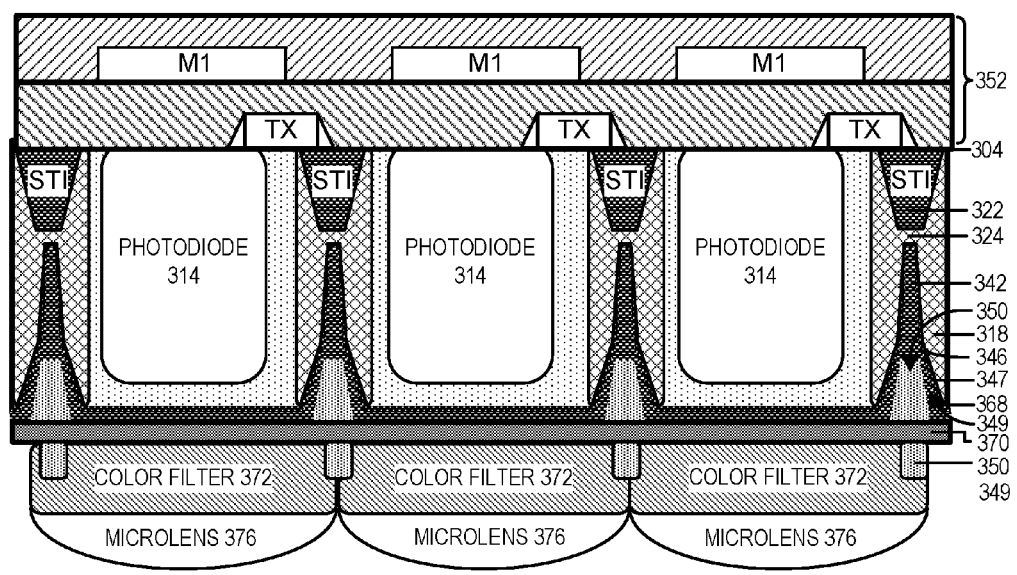

FIG. 3K illustrates forming peripheral circuitry, such as interconnect layer 352, control circuitry, and readout circuitry, laterally proximate to the plurality of photodiodes 314 and electrically coupled to the plurality of photodiodes 314. In one example, interconnect layer 352 is formed on a second side 304 of the semiconductor material 310. FIG. 3K also illustrates forming an optical stack. The optical stack may include a dielectric layer, color filters, microlenses, and other secondary optical structures to optimize image acquisition by the image sensor.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed in a semiconductor material between a first side and a second side of the semiconductor material; and
   a plurality of hybrid deep trench isolation (DTI) structures disposed in the semiconductor material, wherein individual photodiodes in the plurality of photodiodes are separated by individual hybrid DTI structures in the plurality of hybrid DTI structures, each one of the individual hybrid DTI structures including:
      a shallow portion that extends from the first side towards the second side of the semiconductor material, wherein the shallow portion includes a dielectric region and a metal region such that at least part of the dielectric region is disposed between the semiconductor material and the metal region, wherein the dielectric region of the shallow portion includes a first dielectric and a second dielectric, wherein at least part of the second dielectric is disposed between the first dielectric and the metal region; and
      a deep portion that extends from the shallow portion and is disposed between the shallow portion and the second side of the semiconductor material.

2. The image sensor of claim 1, wherein the shallow portion tapers from the first side of the semiconductor material towards the deep portion such that a width of the shallow portion proximate to the first side is greater than the width of the shallow portion proximate to the second side.

3. The image sensor of claim 1, wherein a dielectric constant of the first dielectric is greater than the dielectric constant of the second dielectric.

4. The image sensor of claim 1, wherein the first dielectric and the second dielectric extend from the shallow portion into the deep portion.

5. The image sensor of claim 1, further comprising a plurality of pinning wells disposed in the semiconductor material that extend from the first side to the second side of the semiconductor material, wherein the individual hybrid DTI structures are disposed in individual pinning wells in the plurality of pinning wells.

6. The image sensor of claim 5, further comprising a plurality of shallow trench isolation (STI) structures, wherein individual STI structures in the plurality of STI structures are disposed in the individual pinning wells between the first side and the second side of the semiconductor material, and wherein the individual STI structures are optically aligned with the individual hybrid DTI structures.

7. The image sensor of claim 6, wherein a first region of the individual pinning wells is disposed between the individual STI structures and the individual hybrid DTI structures.

8. The image sensor of claim 6, wherein at least part of the individual STI structures are wider than the deep portion of the individual hybrid DTI structures.

9. The image sensor of claim 6, wherein the individual STI structures taper from the second side of the semiconductor material towards the deep portion such that a width of the individual STI structures proximate to the second side of the semiconductor material is greater than the width of the individual STI structures proximate to the deep portion.

10. The image sensor of claim 1, wherein the metal region tapers from the first side of the semiconductor material towards the deep portion, and wherein off-axis incident light propagates through the first side of the semiconductor material and is reflected by the metal region towards the plurality of photodiodes.

11. A method of image sensor fabrication, comprising:
   providing a semiconductor material having a first side and a second side opposite the first side;
   etching a plurality of first trenches that extend from the first side towards the second side of the semiconductor material;
   widening a shallow portion in each one of the plurality of first trenches proximate to the first side of the semiconductor material, wherein a deep portion in the plurality of first trenches is disposed between the shallow portion and the second side of the semiconductor material;
   depositing dielectric material within the deep portion and the shallow portion in the plurality of first trenches, wherein depositing dielectric material includes depositing a first dielectric material and depositing a second dielectric material, and wherein a dielectric constant of the first dielectric material is greater than the dielectric constant of the second dielectric material;

depositing a metal within a region of the shallow portion such that at least part of the dielectric material is disposed between the metal and the semiconductor material wherein at least part of the second dielectric material is disposed between the first dielectric material and the metal; and forming a plurality of photodiodes disposed in the semiconductor material between the first side and the second side, wherein individual photodiodes in the plurality of photodiodes are separated by individual first trenches in the plurality of first trenches.

12. The method of claim 11, wherein the shallow portion tapers from the first side towards the second side of the semiconductor material such that a width of the shallow portion proximate to the first side is greater than the width of the shallow portion proximate to the second side.

13. The method of claim 11, further comprising forming a plurality of pinning wells disposed in the semiconductor material that extend from the first side to the second side of the semiconductor material, wherein individual first trenches in the plurality of first trenches are disposed in individual pinning wells in the plurality of pinning wells.

14. The method of claim 13, further comprising:
etching a plurality of second trenches that extend from the second side of the semiconductor material towards the deep portion in the plurality of first trenches, and wherein individual second trenches in the plurality of second trenches are optically aligned with the individual first trenches; and depositing a third dielectric material within the plurality of second trenches.

15. The method of claim 14, wherein a first region of the individual pinning wells is disposed between the individual first trenches and the individual second trenches.

16. The method of claim 14, wherein a ratio of the plurality of first trenches, the plurality of second trenches, and the plurality of pinning wells is one-to-one-to-one.

17. The method of claim 14, wherein the individual second trenches taper from the second side of the semiconductor material towards the deep portion of the individual first trenches, wherein a width of the individual second trenches proximate to the second side is greater than the width of the individual second trenches proximate to the deep portion.

18. The method of claim 11, wherein the metal tapers from the first side of the semiconductor material towards the deep portion such that off-axis incident light propagates through the first side of the semiconductor material and is reflected by the metal towards the plurality of photodiodes.

* * * * *